(12) United States Patent
Sargent et al.

(10) Patent No.: US 10,483,493 B2
(45) Date of Patent: Nov. 19, 2019

(54) ELECTRONIC DEVICE HAVING DISPLAY WITH THIN-FILM ENCAPSULATION

(71) Applicant: Apple Inc., Cupertino, CA (US)

(72) Inventors: Daniel B. Sargent, San Francisco, CA (US); John Raff, Menlo Park, CA (US); Li Zhang, Mountain View, CA (US); Victor H. Yin, Cupertino, CA (US); Wenyong Zhu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/864,983

(22) Filed: Jan. 8, 2018

(65) Prior Publication Data

US 2019/0044093 A1 Feb. 7, 2019

Related U.S. Application Data

(60) Provisional application No. 62/539,966, filed on Aug. 1, 2017.

(51) Int. Cl.
| | |
|---|---|
| *H01L 51/52* | (2006.01) |
| *H01L 23/29* | (2006.01) |
| *H01L 49/02* | (2006.01) |
| *H01L 27/32* | (2006.01) |
| *H01L 51/00* | (2006.01) |
| *G06F 1/16* | (2006.01) |
| *H04N 1/00* | (2006.01) |
| *H05K 1/02* | (2006.01) |

(52) U.S. Cl.
CPC ........ *H01L 51/5253* (2013.01); *G06F 1/1601* (2013.01); *H01L 23/291* (2013.01); *H01L 27/3248* (2013.01); *H01L 28/60* (2013.01); *H01L 51/0097* (2013.01); *H01L 51/5203* (2013.01); *H01L 51/5237* (2013.01); *H04N 1/00519* (2013.01); *H01L 27/323* (2013.01); *H05K 1/028* (2013.01)

(58) Field of Classification Search
None
See application file for complete search history.

(56) References Cited

U.S. PATENT DOCUMENTS

| | | | |
|---|---|---|---|
| 6,268,695 | B1 | 7/2001 | Affinito |
| 2005/0179379 | A1 | 8/2005 | Kim |
| 2006/0017055 | A1 | 1/2006 | Cropper et al. |

(Continued)

*Primary Examiner* — Cheung Lee
(74) *Attorney, Agent, or Firm* — Treyz Law Group, P.C.; G. Victor Treyz; David K. Cole

(57) ABSTRACT

An organic light-emitting diode display may have an array of pixels formed from a layer of thin-film circuitry. The thin-film circuitry may be formed on a glass layer that serves as an inner layer of encapsulation for the array of pixels formed from the thin-film circuitry. A thin-film encapsulation layer may overlap the array of pixels and may serve as an opposing outer layer of encapsulation for the array of pixels formed by the thin-film circuitry. An electronic device may have opposing front and rear faces. The display may be mounted in a housing on the front face. The housing may have a planar rear wall on the rear face. A display cover layer associated with the display may overlap the pixel array. A touch sensor and optical layers such as a circular polarizer layer and a compensation layer may be interposed between the display cover layer and the thin-film.

18 Claims, 5 Drawing Sheets

(56) References Cited

U.S. PATENT DOCUMENTS

| | | |
|---|---|---|
| 2008/0012474 A1 | 1/2008 | Sung et al. |
| 2011/0143129 A1 | 6/2011 | Padiyath et al. |
| 2015/0131035 A1* | 5/2015 | Chen ............... G02B 5/305 |
| | | 349/96 |
| 2018/0013191 A1* | 1/2018 | Cameron ........... H01Q 1/243 |
| 2018/0166507 A1* | 6/2018 | Hwang ............. H01L 27/323 |
| 2018/0226454 A1* | 8/2018 | Liu ................. H01L 27/323 |

* cited by examiner

ELECTRONIC DEVICE HAVING DISPLAY WITH THIN-FILM ENCAPSULATION

This application claims the benefit of provisional patent application No. 62/539,966, filed Aug. 1, 2017, which is hereby incorporated by reference herein in its entirety.

FIELD

This relates generally to electronic devices with displays, and, more particularly, to displays with encapsulation to protect display circuitry from moisture and oxygen.

BACKGROUND

Electronic devices often include displays. Displays such as organic light-emitting diode displays contain light-emitting diodes with organic emissive materials and other structures that are sensitive to moisture and oxygen. To prevent intrusion of moisture and oxygen, sensitive display structures may be encapsulated. If care is not taken, however, encapsulated displays may be fragile or thicker than desired.

SUMMARY

An organic light-emitting diode display may have an array of pixels. The pixels may be formed from a layer of thin-film circuitry having organic light-emitting diodes and thin-film transistors. The layer of thin-film circuitry may be formed on a substrate such as a glass substrate layer. The glass substrate layer serves as an inner layer of encapsulation for the array of pixels formed from the thin-film circuitry layer. A thin-film encapsulation layer may overlap the array of pixels and may serve as an opposing outer layer of encapsulation for the array of pixels formed by the thin-film circuitry layer.

The organic light-emitting diode display may be included in an electronic device. The electronic device may have opposing front and rear faces. The display may be mounted on the front face of the device. The device may have a housing in which the display is mounted. The housing may have a planar rear wall on the rear face of the device. A display cover layer associated with the display may overlap the pixel array. A touch sensor and optical layers such as a circular polarizer layer and a compensation layer may be interposed between the display cover layer and the thin-film. A light-blocking layer and a heat-dissipation layer may be coupled to an inner surface of the glass substrate layer.

The pixel array may be controlled using display driver circuitry. A flexible path such as a flexible path formed from a flexible printed circuit may be used to supply signals from the display driver circuitry to the array of pixels formed from the layer of thin-film circuitry. The display driver circuitry may include one or more integrated circuits that are mounted to the flexible printed circuit to supply signals to the array of pixels.

DETAILED DESCRIPTION

To protect sensitive pixel structures, a display may be provided with encapsulation. The pixel structures that are protected by the encapsulation may be light-emitting diodes or other pixel structures. Illustrative configurations in which displays such as organic light-emitting diode displays are provided with encapsulation are described herein as an example.

Figure 1:
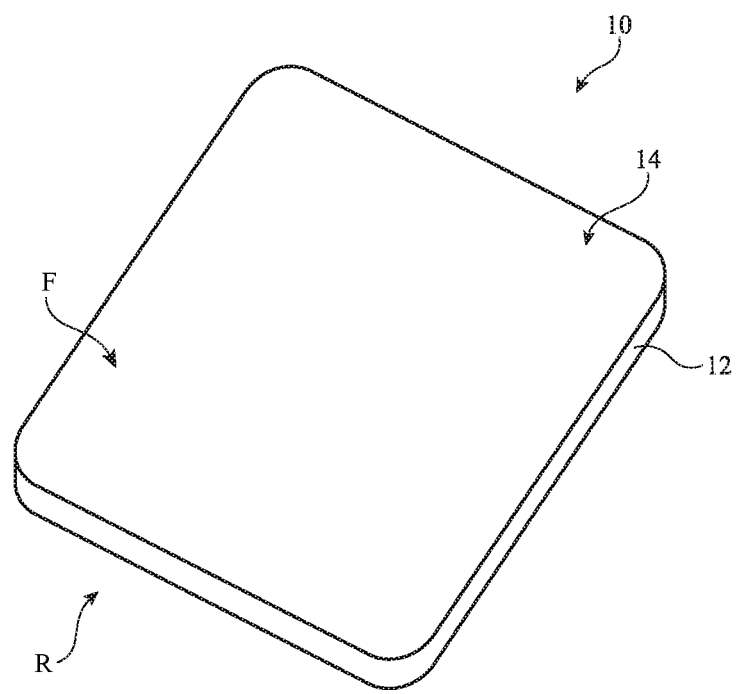
FIG. 1 is a perspective view of an illustrative electronic device in accordance with an embodiment.

An illustrative electronic device with an organic light-emitting diode display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, titanium, gold, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Device 10 may have a front face F on which display 14 is mounted and an opposing rear face R formed by a planar rear housing wall of housing 12.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Figure 2:
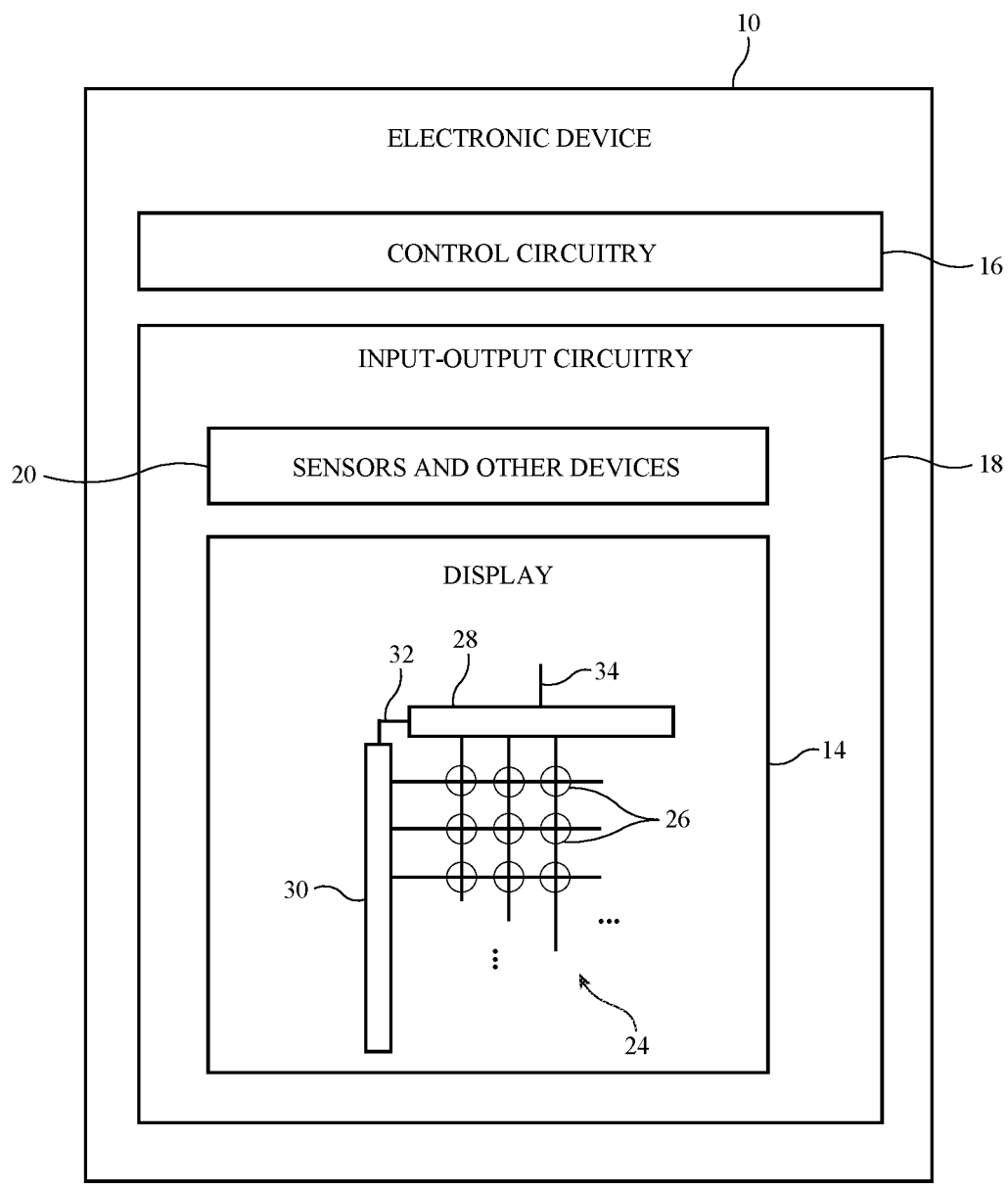
FIG. 2 is a schematic diagram of an illustrative electronic device with a display in accordance with an embodiment.

A schematic diagram of device 10 is shown in FIG. 2. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output circuitry 18 may be used to allow data to be supplied to device 10 and to allow data to be provided from device 10 to external devices. Input-output circuitry 18 may include sensors and other devices 20 (e.g., buttons, joysticks, scrolling wheels, touch pads, key pads, keyboards, microphones, speakers, tone generators, vibrators, cameras, touch sensors, force sensors, light sensors, magnetic sensors, motion sensors, light-emitting diodes and other status indicators, data ports, etc.). A user can control the operation of device 10 by supplying commands through input-output circuitry 18 and may receive status information and other output from device 10 using the output resources of input-output devices 12.

Input-output circuitry 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted).

Control circuitry 16 may be used to run software on device 10 such as operating system code and applications. During operation of device 10, the software running on control circuitry 16 may display images on display 14.

Display 14 may be an organic light-emitting diode display. As shown in FIG. 2, display 14 may have a pixel array such as pixel array 24 for displaying images for a user. Pixel array 24 is formed from an array of pixels 26. The array of pixels 26 may be arranged to from rows and columns. There may be any suitable number of rows and columns in the array of pixels 26 (e.g., ten or more, one hundred or more, or one thousand or more). Pixels 26 may each contain subpixels of different colors. As an example, each pixel 26 may have a red subpixel that emits red light, a green subpixel that emits green light, and a blue subpixel that emits blue light. Configurations for display 14 that include subpixels of other colors may be used, if desired.

Display driver circuitry may be used to control the operation of pixels 26. The display driver circuitry may be formed from integrated circuits, thin-film transistor circuits, or other suitable circuitry. Display driver circuitry 28 of FIG. 2 may contain communications circuitry for communicating with system control circuitry such as control circuitry 16 of FIG. 1 over path 34. Path 34 may be formed from traces on a flexible printed circuit or other cable. During operation, the control circuitry (e.g., control circuitry 16 of FIG. 1) may supply circuitry 28 with information on images to be displayed on display 14 over path 34. If desired, display driver circuitry for display 14 (e.g., display driver circuitry 28) may be formed from one or more integrated circuits mounted on a printed circuit. For example, a flexible printed circuit may be bonded to an edge portion of a substrate on which pixels 26 are formed and one or more integrated circuits for display driver circuitry 28 may be mounted to the flexible printed circuit.

To display images on display pixels 26, display driver circuitry 28 may supply image data to data lines while issuing clock signals and other control signals to supporting display driver circuitry such as gate driver circuitry 30 over path 32. If desired, circuitry 28 may also supply clock signals and other control signals to gate driver circuitry on an opposing edge of display 14.

Gate driver circuitry 30 (sometimes referred to as horizontal control line control circuitry) may be implemented as part of an integrated circuit and/or may be implemented using thin-film transistor circuitry. Horizontal control lines in display 14 (sometimes called gate lines) may carry horizontal control line signals from circuitry 30 (e.g., scan line signals, emission enable control signals, and other horizontal control signals for controlling the pixels of each row). There may be any suitable number of horizontal control signals per row of pixels 26 (e.g., one or more, two or more, three or more, four or more, etc.).

Figure 3:
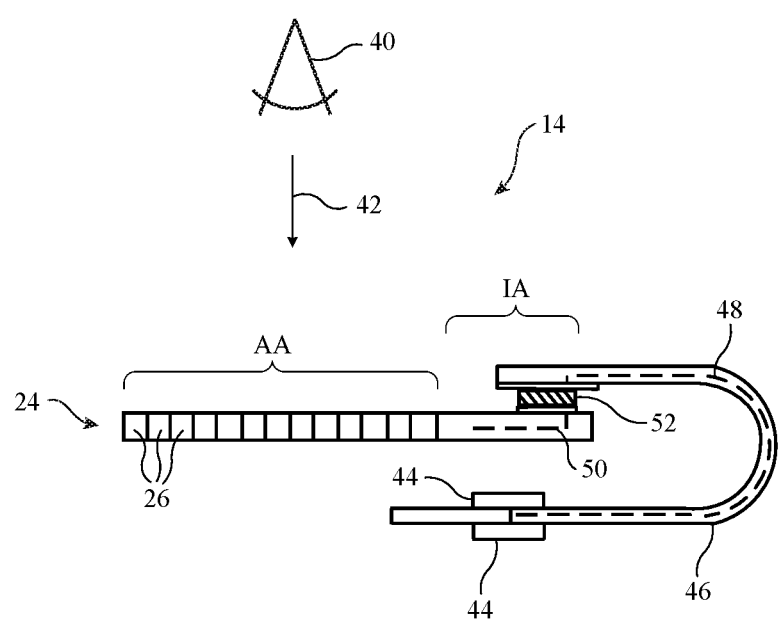
FIG. 3 is a cross-sectional side view of an illustrative display and an associated flexible printed circuit and display driver circuitry in accordance with an embodiment.

A cross-sectional side view of display 14 is shown in FIG. 3. As shown in FIG. 3, pixel array 24 may display images for a user of device 10 such as viewer 40 who is viewing pixels 26 of pixel array 24 in direction 42. Pixel array 24 defines an active area AA for display 14 in which images are displayed. Display 14 may also have one or more inactive border regions such as inactive area IA that run along one or more respective edges of device 14. If desired, display driver circuitry 28 (FIG. 2) may include one or more integrated circuits such as circuits 44 that are formed on one or both surfaces of flexible printed circuit 46. Metal traces 48 in flexible printed circuit 46 may be used to couple integrated circuit(s) 44 to metal traces 50 in pixel array 24. In pixel array 24, traces 50 may be used to distribute control signals, data, and power to pixels 26. Conductive material such as conductive material 52 (solder, conductive adhesive, etc.) may be used in coupling traces 48 to traces 50 (e.g., material 52 may form conductive adhesive bonds, bonds formed from solder joints, or other conductive bonds). Flexible printed circuit 46 may be bent (e.g., by 180° as shown in FIG. 3) so that flexible printed circuit 46 fits within the edges of housing 12.

Figure 4:
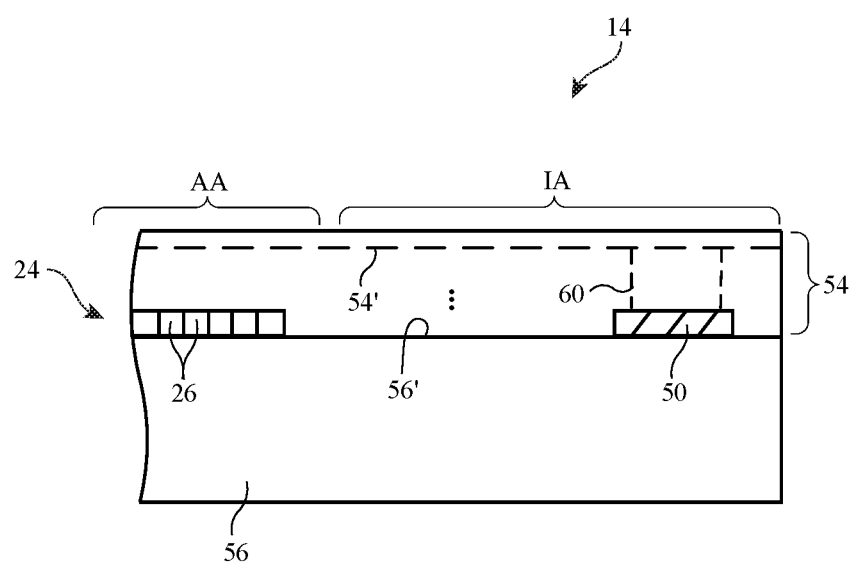
FIG. 4 is a cross-sectional side view of an illustrative electronic device having an encapsulated display in accordance with an embodiment.

FIG. 4 is a cross-sectional side view of display 14 showing how display 14 may include a substrate such as glass substrate 56. Display 14 has thin-film circuitry on surface 56' of substrate 56 that forms pixels 26 of pixel array 24. In active area AA, thin-film encapsulation layer 54 covers the sensitive circuits in the thin-film circuitry of pixel array 24 (e.g., organic emissive material, transistor structures, interconnects, etc.). In inactive area IA, thin-film encapsulation layer 54 covers metal traces such as illustrative metal traces 50. Openings 60 may be formed over some of metal traces 56 in in active area IA to allow conductive bonds to be formed with traces 48 in printed circuit 46 (e.g., using conductive material 52, as shown in FIG. 3).

Layer 54 may include sublayers of material such as sublayers 54'. Sublayers 54' may be formed from multiple respective layers of material and may include, for example, organic dielectric layers such as polymer layers and inorganic dielectric layers such as layers of silicon nitride, silicon oxide, silicon oxycarbide, and silicon oxynitride. Layers 54 may be formed by chemical vapor deposition (e.g., plasma enhanced chemical vapor deposition), atomic layer deposition, sputtering, other deposition processes, or combinations of these processes. In an illustrative configuration, layer 54 contains 2-20 layers 54', at least 4 layers 54', or fewer than 30 layers 54' and one or more of layers 54' is formed from a material that is relatively impermeable to moisture and oxygen such as silicon nitride ($SiN_x$). Other configurations may be used, if desired.

To prevent cracks from allowing moisture and oxygen to penetrate thin-film encapsulation layer 54, layer 54 may, if desired, include a stack of alternating layers (e.g., alternating layers of silicon nitride and other materials such as other inorganic material and/or polymer). Configurations in which layer 54 is formed from a single material may also be used, if desired. In general, any suitable thin-film encapsulation layer arrangement may be used for forming layer 54. By using thin-film deposition techniques (e.g., physical vapor deposition, plasma deposition, chemical vapor deposition, etc.), the thickness of layer 54 may be about 5 microns, 1-20 microns, at least 2 microns, at least 4 microns, less than 10 microns, 1-10 microns, less than 20 microns, or other suitable thickness. The thickness of layer 54 may, as an example, be sufficiently thin to help reduce the overall thickness of display 14 relative to techniques that use thick sheets of glass for covering pixel array 24.

Figure 5:
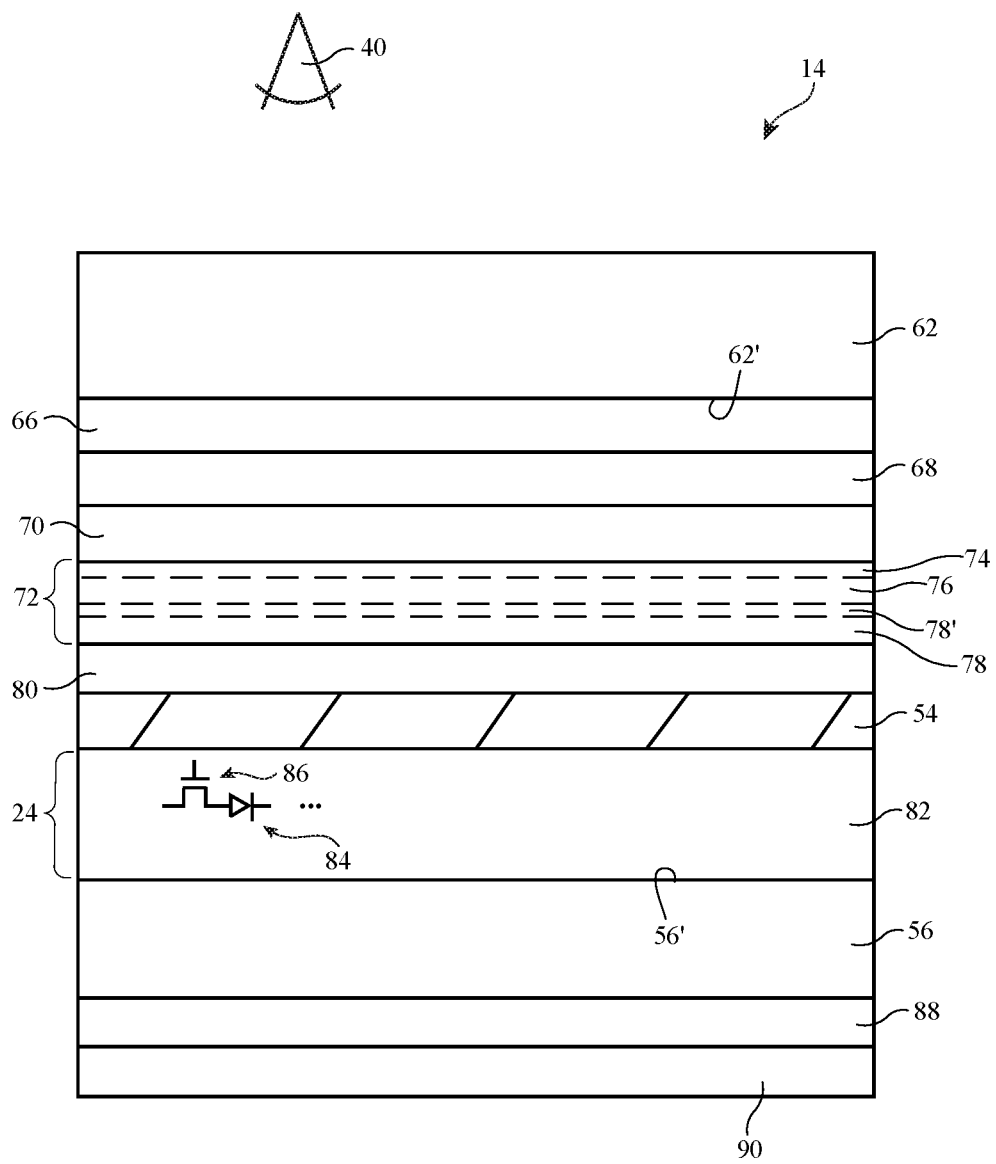
FIG. 5 is a cross-sectional side view of an illustrative display in accordance with an embodiment.

FIG. 5 is a cross-sectional side view of display 14 in a portion of active area AA. As shown in FIG. 5, thin-film circuitry layer 82 may be formed on outer surface 56' of glass substrate 56. Glass substrate 56 may be impermeable to water and may therefore serve as a lower (inner) encapsulation layer for pixels array 24. The outer surface of thin-film circuitry layer 82 may contact the inner surface of thin-film encapsulation layer 54, which may serve as a corresponding upper (outer) encapsulation layer.

Thin-film circuitry layer 82 may include thin-film transistors such as thin-film transistor 86 and thin-film light-emitting diodes such as organic light-emitting diode 84. The thickness of layer 82 may be, for example, 3-8 microns. The circuits of layer 82 form pixels 26 for pixel array 24 and display images for viewer 40 during operation. Display 14 may have a protective outer cover layer such as display cover layer 62. Display cover layer may have a thickness of 0.2-0.6 mm, at least 0.3 mm, less than 0.7 mm, 0.3-0.5 mm, or other suitable thickness. Display cover layer 62 may be formed from a transparent material such as clear glass, transparent polymer, ceramic, crystalline material such as sapphire, or other transparent material. This allows images from pixel array 24 to be viewed by viewer 40.

Inner surface 62' of display cover layer 62 faces the interior of device 10. Adhesive layer 66 may be used to attach a two-dimensional capacitive touch sensor layer such as touch sensor layer 68 to inner surface 62'. Adhesive layer 70 may be coupled to the opposing surface of touch sensor layer 68. Touch sensor layer 68 may include a flexible substrate such as a polyimide substrate and may have an array of capacitive touch sensor electrodes formed from a transparent conductive material such as indium tin oxide. The capacitive touch sensor electrodes may be formed on one or both sides of the flexible substrate. Configurations in which touch sensor electrodes are deposited and patterned directly on inner surface 62' may also be used, if desired. The total thickness of layers 66, 68, and 70 may be about 0.2-0.4 mm (as an example).

Optical films such as layers 72 may be interposed between adhesive layer 70 and optically clear adhesive layer 80. The thickness of layers 72 may be about 0.05-0.2 mm, at least 0.1 mm, or less than 0.3 mm.

Layers 72 may include a linear polarizer such as linear polarizer 74, a retarder layer such as quarter wave plate 76 (e.g., a quarter wave plate that operates in conjunction with linear polarizer 74 to form a circular polarizer that helps suppress reflections from reflective structures in thin-film circuitry 82), and a birefringent compensation layer such as compensation layer 78 to improve off-axis viewing. Compensation layer 78 may be attached to the inner (inwardly facing) surface of quarter wave plate 76 with a layer of optically clear adhesive such as adhesive layer 78' or layer 78' may be omitted and compensation layer 78 formed as a birefringent coating on quarter wave plate 76.

Optically clear adhesive layer 80 may be used in attaching thin-film encapsulation layer 54 to optical layers 72 (e.g., to the inner surface of compensation layer 78). As described in connection with FIG. 4, thin-film encapsulation layer 54 may include a stack of dielectric layers such as a stack of inorganic dielectric layers (and, if desired, organic layers) to help block moisture and oxygen and thereby protect thin-film circuitry 82.

To help block stray light, inner surface 56'' of glass substrate layer 56 may be covered with one or more light blocking layers such as light blocking layer 88. Layer 88 may be a layer of black ink (e.g., a polymer ink binder with black dye and/or pigment), a polymer film (e.g., a sheet of polyester with embedded black dye or pigment for blocking light), and/or other opaque material. A heat spreading layer such as layer 90 (e.g., a layer of graphite) may be used to help dissipate heat. Layers 88 and 90 are generally relatively thin (e.g., less than 50 microns thick) and therefore do not substantially support display 14. Glass substrate layer 56, however, may be about 0.1-0.3 mm thick, at least 0.15 mm thick, at least 0.2 mm thick, less than 0.3 mm, less than 0.4 mm thick, less than 0.25 mm thick, or other suitable thickness that imparts rigidity and helps support and flatten layer 82. Some flexible plastic organic light-emitting diode displays include metal stiffeners under their pixel arrays. With one illustrative configuration, substrate 56 of display 14 of FIG. 5 is sufficiently supportive that display 14 need not include any metal stiffener layers under layer 82 so there is no metal stiffener between layer 82 and either layer 88 or layer 90. This arrangement for display 14 of FIG. 5 (e.g., the use of a relatively thin glass substrate, etc.) may help reduce overall display thickness.

The foregoing is merely illustrative and various modifications can be made to the described embodiments. The foregoing embodiments may be implemented individually or in any combination.

What is claimed is:

1. Apparatus, comprising:
   a glass substrate;
   a thin-film encapsulation layer;
   a layer of thin-film transistor circuitry including transistors and organic light-emitting diodes that is configured to form a pixel array that displays images, wherein the layer of thin-film transistor circuitry has a first surface that contacts the thin-film encapsulation layer and an opposing second surface that contacts the glass substrate;
   a light-blocking layer, wherein the glass substrate layer has a first surface that is contacted by the thin-film transistor circuitry and has a second surface that is contacted by the light-blocking layer; and
   a heat spreading layer, wherein the light-blocking layer is interposed between the heat spreading layer and the glass substrate.

2. The apparatus defined in claim 1 wherein the glass substrate has a thickness of less than 0.3 mm and wherein the apparatus further comprises:
   a flexible printed circuit coupled to an edge of the layer of thin-film transistor circuitry; and a display driver integrated circuit mounted on the flexible printed circuit.

3. The apparatus defined in claim 1 wherein the glass substrate has a thickness of less than 0.25 mm.

4. The apparatus defined in claim 1 further comprising:
a two-dimensional touch sensor layer; and
a circular polarizer interposed between the two-dimensional touch sensor layer and the thin-film encapsulation layer.

5. The apparatus defined in claim 4 further comprising a birefringent compensation layer between the circular polarizer and the thin-film encapsulation layer.

6. The apparatus defined in claim 5 further comprising a layer of adhesive that attaches the birefringent compensation layer to the circular polarizer.

7. The apparatus defined in claim 4 further comprising:
a transparent display cover layer, wherein the two-dimensional touch sensor layer is interposed between the transparent display cover layer and the circular polarizer.

8. The apparatus defined in claim 1 wherein the light-blocking layer comprises a black polymer layer.

9. The apparatus defined in claim 8 further comprising a layer of graphite on the black polymer layer.

10. An electronic device, comprising:
an organic light-emitting diode display having:
  a glass substrate that forms an inner encapsulation layer;
  a thin-film encapsulation layer that forms an outer encapsulation layer;
  a layer of thin-film transistor circuitry interposed between the inner and outer encapsulation layers, wherein the layer of thin-film transistor circuitry includes transistors and organic light-emitting diodes and is configured to form a pixel array that displays images;
  a quarter wave plate; and
  a birefringent compensation film interposed between the quarter wave plate and the thin-film encapsulation layer;
a housing in which the organic light-emitting diode display is mounted;
display driver circuitry in the housing; and
a flexible path that couples the display driver circuitry to the organic light-emitting diode display.

11. The electronic device defined in claim 10 wherein the flexible path comprises a flexible printed circuit coupled to traces in the thin-film encapsulation layer.

12. The electronic device defined in claim 11 wherein the flexible printed circuit is bent and wherein the display driver circuitry comprises an integrated circuit mounted to the flexible printed circuit.

13. The electronic device defined in claim 10 wherein the glass substrate has a thickness of less than 0.25 mm.

14. The electronic device defined in claim 10 further comprising:
a display cover layer;
a first layer of adhesive that is attached to the display cover layer;
a touch sensor layer in contact with the first layer of adhesive;
a second layer of adhesive that is in contact with the touch sensor; and
a linear polarizer that is in contact with the second layer of adhesive.

15. The electronic device defined in claim 10 wherein the thin-film encapsulation layer includes at least one inorganic layer.

16. The electronic device defined in claim 15 wherein the thin-film encapsulation layer includes a plurality of inorganic layers.

17. An electronic device having opposing front and rear faces, comprising:
a housing having a rear wall on the rear face;
an organic light-emitting diode display coupled to the housing on the front face, wherein the organic light-emitting diode display comprises:
  a display cover layer that covers the front face;
  a glass substrate;
  a layer of thin-film transistor circuitry on the glass substrate that includes transistors and organic light-emitting diodes and that is configured to form a pixel array that displays images through the display cover layer; and
  a thin-film encapsulation layer, wherein the layer of thin-film transistor circuitry is interposed between the glass substrate and the thin-film encapsulation layer, wherein the thin-film encapsulation layer has a thickness of less than 10 microns.

18. The electronic device defined in claim 17 wherein the glass substrate has a thickness of less than 0.25 mm, the electronic device further comprising:
a touch sensor interposed between the display cover layer and the thin-film encapsulation layer.

* * * * *